United States Patent [19]
Sato et al.

[11] Patent Number: 5,276,281
[45] Date of Patent: Jan. 4, 1994

[54] SUPERCONDUCTING CONDUCTOR

[75] Inventors: Kenichi Sato; Hidehito Mukai; Nobuhiro Shibuta, all of Osaka, Japan

[73] Assignee: Sumitomo Electric Industries, Ltd., Japan

[21] Appl. No.: 935,664

[22] Filed: Aug. 24, 1992

Related U.S. Application Data

[63] Continuation of Ser. No. 685,356, Apr. 15, 1992.

[30] Foreign Application Priority Data

| Apr. 13, 1990 | [JP] | Japan | 2-98941 |
| Aug. 7, 1990 | [JP] | Japan | 2-210023 |
| Aug. 27, 1990 | [JP] | Japan | 2-226332 |

[51] Int. Cl.$^5$ .................................. H01B 12/00
[52] U.S. Cl. ........................ 174/125.1; 505/1; 505/886; 505/887
[58] Field of Search ............ 174/15.4, 15.5, 125.1; 505/1, 856, 866, 884, 885, 886, 887, 704

[56] References Cited

U.S. PATENT DOCUMENTS

| 3,428,926 | 2/1969 | Bogner et al. | 174/15.4 |
| 3,657,466 | 4/1982 | Woolcock et al. | 174/15.4 |
| 4,377,905 | 3/1983 | Agatsuma et al. | 29/599 |
| 4,942,379 | 7/1990 | Ogawa et al. | 335/301 |

FOREIGN PATENT DOCUMENTS

| 0284097 | 9/1988 | European Pat. Off. |
| 333038 | 9/1988 | European Pat. Off. |
| 297061 | 12/1989 | European Pat. Off. |
| 2749052 | 5/1978 | Fed. Rep. of Germany. |
| 1463138 | 12/1966 | France | 174/15.5 |
| 13911 | 1/1989 | Japan | 174/15.4 |
| 1204313 | 8/1989 | Japan | 174/15.5 |
| 476408 | 7/1969 | Switzerland. |

Primary Examiner—Leo P. Picard
Assistant Examiner—Bot Ledynh
Attorney, Agent, or Firm—Pennie & Edmonds

[57] ABSTRACT

A superconducting conductor, having an excellent repeated temperature property with no reduction of critical current density against a temperature cycle, comprises an oxide superconductor and an fiber reinforced plastic ("FRP"), serving as a support member, which is composed with the oxide superconductor for integrally moving with the oxide superconductor in thermal expansion and thermal shrinkage. The oxide superconductor is bonded to the FRP with an adhesive agent, or wound on and fixed to the same with a Teflon tape or the like.

16 Claims, 4 Drawing Sheets

SUPERCONDUCTING CONDUCTOR

This is a continuation of application Ser. No. 07/685,356 filed Apr. 15, 1992.

BACKGROUND OF THE INVENTION

1. Field of the Invention

The present invention relates to a superconducting conductor employing an oxide superconducting material.

2. Description of the Background Art

In recent years, superconductors of ceramics, i.e., oxide superconductors, have been watched with interest as superconducting materials which exhibit higher critical temperatures. In particular, superconductors of yttrium, bismuth and thallium, which show high critical temperatures of about 90 K, 110 K and 120 K respectively, are expected as practicable materials. A wire of such an oxide superconductor, which is covered with a metal sheath, is particularly suitable for long wire fabrication. Thus, study has been made as to application of such an oxide superconductor to a cable, a bus bar, a current lead, a magnet and the like.

However, it is difficult to independently apply such a high-temperature superconducting material to a cable, a current lead or the like, since there is some problem regarding strength.

Further the superconducting material must withstand a temperature cycles between the working temperature and the room temperature. Superconducting properties, particularly the critical current density, of a conventional superconducting conductor have problem reduced due to such a temperature change.

SUMMARY OF THE INVENTION

An object of the present invention is to provide a superconducting conductor which has an excellent repeated temperature property with no reduction of critical current density against a temperature change.

The superconducting conductor according to the present invention comprises an oxide superconductor and a support member which is composed with the oxide superconductor to integrally operate with the same in thermal expansion and thermal shrinkage.

According to the present invention, the support member can be formed of a metal or a nonmetal. The metal can be prepared from silver, copper, aluminum, nickel or stainless steel, or an alloy or a composite material thereof, for example. The nonmetal may be prepared from plastic which is reinforced by an inorganic materials such as fiber reinforced plastic ("FRP") or carbon fiber reinforced plastic ("CFRP"), or crystallized polymer. Inorganic particles of alumina etc. can be also employed as the inorganic materials. Alternatively, the support member may be formed by a composite of different materials.

The oxide superconductor employed in the present invention may be prepared from any one of yttrium, bismuth and thallium. In particular, a bismuth oxide superconductor which contains a 2223 phase i.e., a 110 K phase, having a longitudinally oriented a-b plane, is most advantageously applied. Such a bismuth oxide superconductor is also preferable due to excellence in critical temperature and critical current density, small toxicity, and no requirement for rare earth elements.

The oxide superconductor employed in the present invention preferably has metallic coating. A metal for such metallic coating is preferably not reactive with the superconductor, and has excellent workability and such small resistivity that the same serves as a stabilizer. The metal, such as silver or a silver alloy, for example, is adapted to cover the high-temperature superconductor or to provide an intermediate layer between the high-temperature superconductor and its coat. In the latter case, the intermediate layer is coated with another metal such as copper or aluminum, or an alloy thereof.

According to the present invention, the oxide superconductor and the support member can be composed with each other by a mechanical or physical method such as taping, bonding with an adhesive agent, or diffused bonding.

The adhesive agent may contain fiber and/or particles. In particular, such an adhesive agent is preferably employed for composing a nonmetal support member and a superconducting wire which is coated with a metal, in view of reliability. When taping is employed, on the other hand, it is preferable to use a tape which is provided with a resin material having a bonding function. In this case, the resin material is hardened after taping.

The oxide superconductor employed in the present invention may be in the form of a tape. In general, powder of an oxide superconducting material is filled into a metal sheath, which in turn is drawn and compressed and/or rolled, to be shaped into a tape. It is known that such a tape-type wire generally exhibits a high critical current density.

Such a tape-type oxide superconductor is now described with reference to a bismuth oxide superconducting material, for example.

Powder, which is based on such a 2223 composition that 20% of bismuth is substituted by lead, is so treated that the superconducting phase is mainly composed of a 2212 phase. This powder is filled into a metal pipe, preferably a silver pipe, and subjected to deformation processing and heat treatment, in order to obtain a superconductor having a high target critical current density. When the powder is filled into the metal sheath in a submicron state, it is possible to obtain a superconducting conductor having a high uniformity.

The heat treatment temperature is properly selected depending on the heat treatment atmosphere. When the oxygen partial pressure is reduced, for example, the heat treatment temperature is set at a relatively low level.

The metal sheath is preferably formed of a material which is not reactive with the superconducting material and has excellent workability. For example, the metal sheath may be prepared from silver, a silver alloy, gold or a gold alloy, or provided with an intermediate layer of such a material. Further, the metal sheath preferably serves as a stabilizer under working conditions.

The oxide superconductor covered with such a metal sheath is preferably drawn at a draft of at least 80%. The draft for rolling is also preferably at least 80%. When the rolling is performed a plurality of times, the draft for a single pass is preferably at least 40%. When the rolling or drawing is again performed after the heat treatment, the draft may be 10 to 30%. The rolling may be performed with a roll or a press.

According to the present invention, the support member preferably has a linear expansion coefficient which is as close to that of the oxide superconductor as possible. Therefore, the linear expansion coefficient of the support member is preferably not more than $20\times10^{-6}$/°C., more preferably, not more than $10\times10^{-6}$/°C. The linear expansion coefficient of the composite superconducting conductor, which is varied with the sectional ratios of the superconductor, the metal sheath and the support member, is preferably not more than $10\times10^{-6}$/°C., more preferably, not more than $10\times10^{-6}$/°C.

According to a preferred mode of the present invention, the support member has a polygonal outer periphery. The oxide superconductor is composed with each outer peripheral plane.

According to another preferred mode of the present invention, the support member has an I-shaped a H-shaped section. The oxide superconductor is composed with at least one surface of the support member.

According to still another preferred mode of the present invention, the support member has a recess portion. The oxide superconductor is arranged in and composed with the recess portion. In this mode, a plurality of tape-type oxide superconductors may be superimposed and arranged in the recess portion.

According to a further preferred mode of the present invention, the support member is provided with a spiral groove on its outer peripheral surface. The oxide superconductor is arranged in the spiral groove. According to this mode, the superconducting conductor is advantageously applied to a coil due to the spirally arranged oxide superconductor.

In the superconducting conductor according to the present invention, the support member and the oxide superconductor are so composed with each other as to integrally move against thermal expansion and thermal shrinkage. Therefore, the superconducting conductor is improved in repeated temperature property, and can regularly effectuate stable superconducting properties against stress. Thus, it is possible to suppress reduction of the critical current density.

The superconducting conductor according to the present invention having such stable superconducting properties can be advantageously applied to a cable, a bus bar, a current lead, a magnet or the like.

These and other objects, features, aspects and advantages of the present invention will become more apparent from the following detailed description of the present invention when taken in conjunction with the accompanying drawings.

DESCRIPTION OF THE PREFERRED EMBODIMENTS

EXAMPLE 1

Powder materials of $Bi_2O_3$, $PbO$, $SrCO_3$, $CaCo_3$ and $CuO$ were blended so that Bi, Pb, Sr, Ca and Cu were in composition ratios of 1.80:0.40:2.01:2.21:3.02. The mixed powder was heat treated at 700° C. for 12 hours and 800° C. for 8 hours. Then the powder was heat treated at 760° C. for 8 hours in a decompressed atmosphere of 1 Torr. The powder was pulverized after each heat treatment.

This powder was pulverized with a ball mill, to obtain submicron powder. The submicron powder was degassed at 800° C. for 10 minutes in a decompressed atmosphere.

This powder was filled into a silver pipe of 12 mm in outer diameter, which in turn was drawn into 1.0 mm in wire diameter. The as-formed wire was rolled into 0.18 mm in thickness, to obtain a tape-type wire. This wire was heat treated at 850° C. for 50 hours, and rolled into 0.14 mm in thickness. Thereafter the wire was further heat treated at 840° C. for 50 hours.

The tape-type wire obtained in the aforementioned manner exhibited a critical current density of 1800 $A/cm^2$ at the liquid nitrogen temperature. This wire was cut into pieces of 50 cm in length, and bonded to outer peripheral surfaces of an FRP pipe having a decagonal outer periphery with an adhesive agent, to be composed with the FRP pipe.

Figure 1:
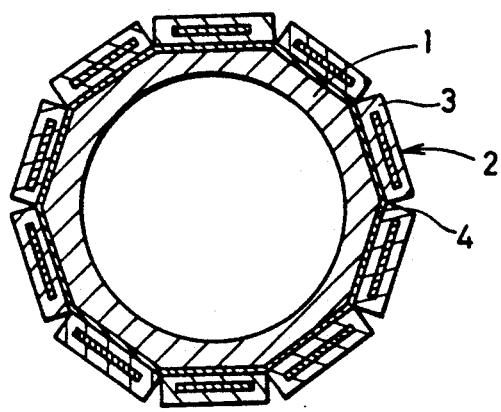
FIG. 1 is a sectional view showing Example 1 of the present invention.

FIG. 1 is a sectional view showing a superconducting conductor composed in the above manner. Referring to FIG. 1, 10 oxide superconductors 2 are mounted on outer peripheral surfaces of a decagonal FRP pipe 1 through bonding layers 4, to be integrally composed therewith. Each oxide superconductor 2 has an Ag sheath as a coating layer.

EXAMPLE 2

A tape-type wire of an oxide superconductor was prepared similarly to Example 1. This wire was composed with a decagonal FRP pipe also similarly to Example 1, but not with an adhesive agent. Pieces of oxide superconductor were arranged around the FRP pipe, and bound with a Teflon tape.

Figure 2:
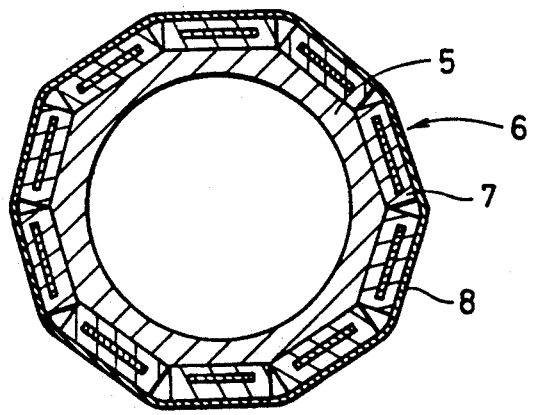
FIG. 2 is a sectional view showing Example 2 of the present invention.

FIG. 2 is a sectional view showing a superconducting conductor obtained in the above manner. Referring to FIG. 2, 10 oxide superconductors 6 are arranged around a decagonal FRP pipe 5, and bound with a Teflon tape 8. The oxide superconductors 6 are integrally composed with the FRP pipe 5 by the Teflon tape 8. The oxide superconductors 6 have Ag sheaths, 7 serving as coating layers.

COMPARATIVE EXAMPLE 1

A tape-type wire of an oxide superconductor was prepared similarly to Example 1. This wire was composed with a decagonal FRP pipe. Only both ends of the oxide superconductors were fixed to the FRP pipe with soldering themselves.

All composite superconducting conductors obtained according to Examples 1 and 2 and comparative example 1 showed linear expansion coefficients of $7\times10^{-6}$/°C.

Critical current densities of these composite superconducting conductors were repeatedly measured at the liquid nitrogen temperature and the ordinary room temperature, to evaluate deterioration of the critical current densities after 10 cycles. As the result, the critical current densities of Example 1, Example 2 and comparative example 1 were reduced by 3%, 4% and 80% respectively.

EXAMPLE 3

The tape-type wire of the oxide superconductor prepared in Example 1 was composed with a decagonal silver pipe. The Ag sheath covering the oxide superconductor was brought into diffusion bonding with each outer surface of the silver pipe to be composed therewith in second heat treatment.

COMPARATIVE EXAMPLE 2

A tape-type wire was prepared similarly to Example 1. This wire was arranged around a silver pipe having a circular outer periphery. Dissimilarly to Example 3, it was impossible to join the surface of the oxide superconductor with the outer peripheral surface of the silver pipe since the peripheral surface of the silver pipe was in a circular configuration.

The as-formed composite superconducting conductor showed a linear expansion coefficient of $12 \times 10^{-6}/°C$.

Critical current densities of the composite superconducting conductors according to Example 3 and comparative example 2 were also repeatedly measured at the liquid nitrogen temperature and the ordinary room temperature, to evaluate reduction of the critical current densities after 10 cycles. As the result, the critical current density of the superconducting conductor according to Example 3 was reduced by 8%, while that of the superconducting conductor according to comparative example 2 was reduced by 85%.

As clearly understood from the above, the critical current densities were not much reduced by temperature changes in the superconducting conductors according to Examples of the present invention, which were composed for integral movement.

EXAMPLE 4

Oxides or carbonates of Bi, Pb, Sr, Ca and Cu were mixed so that these metals were in composition ratios of 1.80:0.46:2.00:2.22:3.04, to prepare powder which was formed of a 2212 phase and non-superconducting phases by heat treatment.

This powder was degassed at 700° C. for 3 hours in a decompressed atmosphere of 8 Torr. This powder was filled into a silver pipe of 12 mm in outer diameter and 8 mm in inner diameter to be coated with silver, drawn into 1 mm in diameter, and then rolled into 0.2 mm in thickness, to prepare a wire.

This wire was heat treated at 845° C. for 50 hours, then rolled at a draft of 15%, and heat treated at 840° C. for 50 hours, to obtain a tape-type wire.

Superconducting properties of this tape-type wire were evaluated in a length of 20 m. As the result, the tape-type wire exhibited excellent properties of a critical current density of 24000 A/cm$^2$ and a critical current of 29 A in liquid nitrogen.

Figure 3:
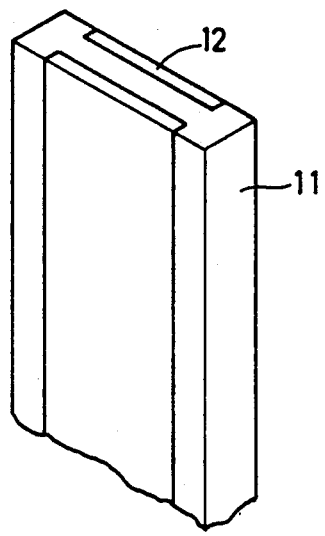
FIG. 3 is a perspective view showing Example 4 of the present invention.

As shown in FIG. 3, a pair of such tape-type wires 11 of 50 cm in length were arranged on both sides of an FRP support member 12, and bonded thereto with an epoxy adhesive agent. The as-formed superconducting conductor showed stable superconducting properties, with no changes against 40 repeated temperature cycles between the room temperature and 77 K.

EXAMPLE 5

A wire similar to that of Example 4 was rolled at a draft of 15%. Five such wires were superimposed and heat treated at 840° C. for 50 hours.

Figure 4:
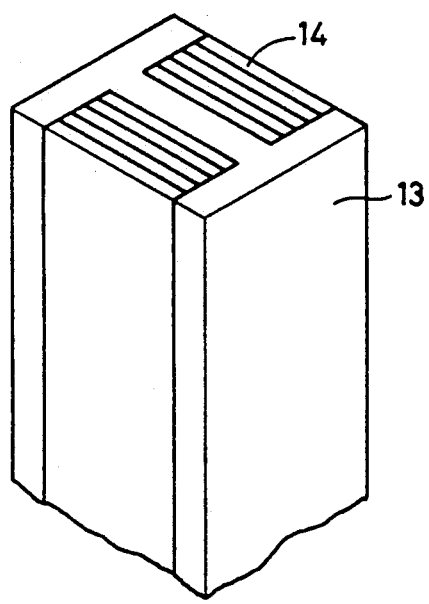
FIG. 4 is a perspective view showing Example 5 of the present invention.

As shown in FIG. 4, a pair of such tape-type wires 14 of 50 cm in length were bonded onto both sides of an FRP support member 13 with an epoxy adhesive agent, which contained cut pieces of glass fiber. This superconducting conductor exhibited a critical current of 320 A at the liquid nitrogen temperature, and showed stable superconducting properties against 100 temperature cycles between the room temperature and 77 K.

As described above, the superconducting conductors according to Examples 4 and 5 showed stable superconducting properties against repeated temperature cycles.

EXAMPLE 6

Oxides or carbonates containing Bi, Pb, Sr, Ca and Cu were mixed with each other so that these elements were in composition ratios of 1.77:0.46:2.01:2.20:3.01. The mixed powder was heat treated to prepare powder which was formed of a 2212 phase, containing Bi+Pb, Sr, Ca and Cu in composition ratios of about 2:2:1:2, and non-superconducting phase.

This powder was degassed at 700° C. for 3 hours in a decompressed atmosphere of 12 Torr.

The as-formed powder was covered with a silver pipe of 12 mm in outer diameter and 8 mm in inner diameter, drawn into 1 mm in outer diameter, and then rolled into 0.2 mm in thickness. This wire was heat treated at 840° C. for 50 hours, and then rolled at a draft of 15%.

The as-formed tape-type wire was cut into pieces of 50 cm in length. 10 such pieces were superimposed and heat treated at 840° C. for 50 hours.

Figure 5:
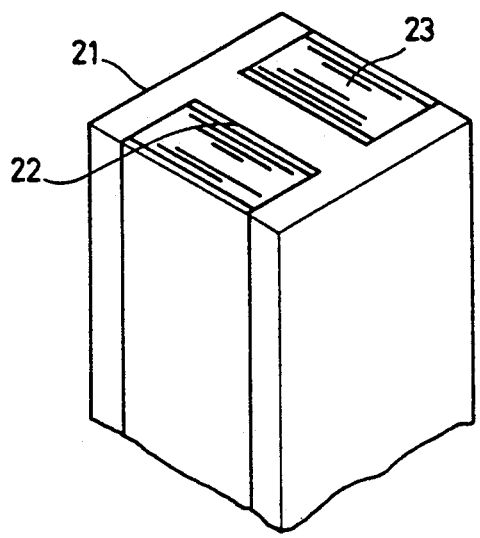
FIG. 5 is a perspective view showing a superconducting conductor according to Example 6 of the present invention.

As shown in FIG. 5, a pair of such decadal tape-type wires 23 were arranged in concave portions 22 provided on both sides of a support member 21, and bonded thereto with an epoxy adhesive agent.

The as-formed superconducting conductor exhibited a critical current of 250 A at the liquid nitrogen temperature. Further, this superconducting conductor showed stable superconducting properties, with no changes against 110 repeated temperature cycles between the room temperature and 77 K.

EXAMPLE 7

Oxides or carbonates containing Bi, Pb, Sr, Ca and Cu were mixed so that these elements were in composition ratios of 1.79:0.41:1.97:2.26:2.95. This mixed powder was heat treated to prepare powder which was formed of a 2212 phase and non-superconducting phases.

Then the powder was degassed at 720° C. for 5 hours in a decompressed atmosphere of 9 Torr.

The as-formed powder was covered with a silver pipe of 9 mm in outer diameter and 6 mm in inner diameter, drawn into 1 mm in outer diameter, and then rolled into 0.2 mm in thickness.

Eight such wires were superimposed and brought into diffusion bonding with each other, heat treated at 840° C. for 50 hours, and thereafter rolled at a draft of 15%.

The as-formed wire was cut into a length of 50 cm, and heat treated at 840° C. for 50 hours.

Figure 6:
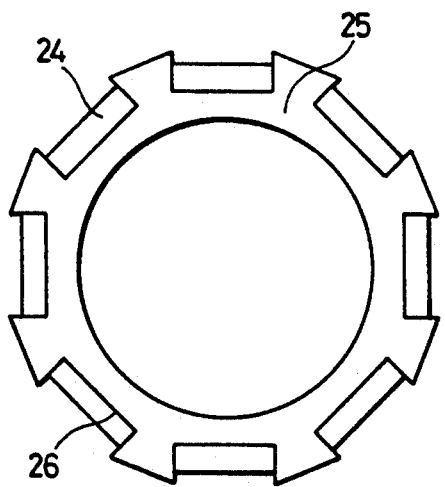
FIG. 6 is a sectional view showing a superconducting conductor according to Example 7 of the present invention.

As shown in FIG. 6, such octal tape-type wires 24 were bonded to recess portions 26 of an octagonal FRP support member 25 with an epoxy adhesive agent, similarly to Example 6. The epoxy adhesive agent contained cut pieces of glass fiber.

The as-formed superconducting conductor exhibited a critical current of 770 A at the liquid nitrogen temperature. Further, this superconducting conductor showed stable properties against 100 temperature cycles between the room temperature and 77 K.

EXAMPLE 8

Oxides or carbonates containing Bi, Pb, Sr, Ca and Cu were mixed with each other so that these elements were in composition ratios of 1.78:0.44:1.99:2.23:2.98. This mixed powder was heat treated to prepare powder which was formed of a 2212 phase and non-superconducting phases.

This powder was degassed at 710° C. for 8 hours in a decompressed atmosphere of 4 Torr.

The as-formed powder was covered with a silver pipe of 12 mm in outer diameter and 8 mm in inner diameter, drawn into 1 mm in outer diameter, and then inserted in a silver pipe having a larger diameter, to prepare a multicore wire having 1296 cores. The multicore wire was drawn into 1 mm in outer diameter, and then rolled into 0.17 mm in thickness.

Five such tape-type wires were superimposed and brought into contact with each other, heat treated at 840° C. for 50 hours, rolled at a draft of 12%, and further heat treated at 840° C. for 50 hours.

Figure 7:
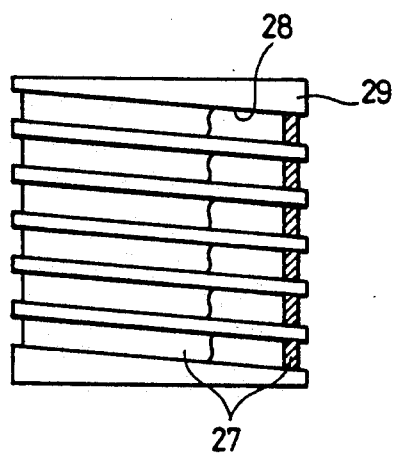
FIG. 7 is a front elevational view showing a coil according to Example 8 of the present invention.

As shown in FIG. 7, such a tape-type wire 27 was wound on an FRP bobbin 29, which was provided with a spirally extending groove 28 on its outer peripheral surface. The wire 7 was bonded to the bobbin 29 with epoxy resin. Thus, a coil of 15 mm in inner diameter and 60 mm in height was prepared as shown in FIG. 7.

This coil exhibited a critical current of 60 A at the liquid nitrogen temperature. Further, this coil showed stable properties against 100 temperature cycles between the room temperature and 77 K. Also when an external magnetic field was applied, this coil showed stable properties with no movement of the wire 27.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A superconducting conductor comprising:
 a superconducting member comprised of a high temperature oxide superconductor provided with a metal coating; and
 a support member continuously secured to said superconducting member for integrally moving with said superconducting member in thermal expansion and thermal shrinkage.

2. A superconducting conductor in accordance with claim 1, wherein said support member has a linear expansion coefficient which is close to that of said oxide superconductor.

3. A superconducting conductor in accordance with claim 1, wherein said superconducting member is continuously secured to said support member by bonding with an adhesive agent.

4. A superconducting conductor in accordance with claim 3, wherein said adhesive agent contains fiber.

5. A superconducting conductor in accordance with claim 3, wherein said adhesive agent contains fiber particles.

6. A superconducting conductor in accordance with claim 3, wherein said adhesive agent contains fiber and fiber particles.

7. A superconducting conductor in accordance with claim 1, wherein said support member is a metal, fiber reinforced plastic, carbon fiber reinforced plastic, plastic reinforced by inorganic materials, crystallized polymer, or a composite thereof.

8. A superconducting conductor in accordance with claim 1, wherein said superconducting member is a tape.

9. A superconducting conductor in accordance with claim 1, wherein said superconducting member contains a bismuth superconducting material.

10. A superconducting conductor in accordance with claim 1, wherein said support member is comprised of a plurality of recesses along its outer periphery, and one superconducting member is attached to each recess thereof.

11. A superconducting conductor in accordance with claim 1, wherein said support member is comprised of an I-shaped or H-shaped section, and said superconducting member is attached to at least one surface of said support member.

12. A superconducting conductor in accordance with claim 1, wherein said support member is comprised of a recess portion, and said superconducting member is arranged in said recess portion.

13. A superconducting conductor in accordance with claim 12, wherein said superconducting member is a tape, and a plurality of superimposed superconducting members are arranged in said recess portions.

14. A superconducting conductor in accordance with claim 1, wherein said support member is comprised of a spiral groove on its outer periphery surface, and said superconducting member is arranged in said groove.

15. A superconducting conductor in accordance with claim 1, wherein said superconducting member is continuously secured to said support member by taping.

16. A superconducting conductor in accordance with claim 1, wherein said superconducting member is continuously secured to said support member by diffused bonding.

* * * * *

UNITED STATES PATENT AND TRADEMARK OFFICE
CERTIFICATE OF CORRECTION

PATENT NO. : 5,276,281

DATED : January 4, 1994

INVENTOR(S) : Kenichi Sato, Hidehito Mukai, Nobuhiro Shibuta, all of Osaka Japan.

It is certified that error appears in the above-identified patent and that said Letters Patent is hereby corrected as shown below:

On the title page, Item [63]: change "Continuation of Ser. No. 685,356, Apr. 15, 1992" to - Continuation of Ser. No. 685,356, Apr. 15, 1991 -.

Signed and Sealed this

Eighteenth Day of October, 1994

Attest:

BRUCE LEHMAN

*Attesting Officer*    *Commissioner of Patents and Trademarks*